United States Patent
Park et al.

(10) Patent No.: US 12,484,309 B2
(45) Date of Patent: Nov. 25, 2025

(54) DISPLAY DEVICE

(71) Applicant: LG Display Co., Ltd., Seoul (KR)

(72) Inventors: KwanWoong Park, Paju-si (KR); ZongGun Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/922,960

(22) Filed: Oct. 22, 2024

(65) Prior Publication Data
US 2025/0151402 A1 May 8, 2025

(30) Foreign Application Priority Data
Nov. 6, 2023 (KR) .................. 10-2023-0151426

(51) Int. Cl.
| | |
|---|---|
| *G09G 3/20* | (2006.01) |
| *H10D 86/40* | (2025.01) |
| *H10D 86/60* | (2025.01) |
| *H10K 59/131* | (2023.01) |
| *H10K 59/95* | (2023.01) |
| *H10K 102/00* | (2023.01) |

(52) U.S. Cl.
CPC ........... *H10D 86/60* (2025.01); *H10D 86/441* (2025.01); *H10K 59/131* (2023.02); *H10K 59/95* (2023.02); *H10K 2102/341* (2023.02)

(58) Field of Classification Search
CPC ...... G09G 3/20; G09G 3/3225; H10D 86/441; H10D 86/60; H10K 59/12; H10K 59/85; H10K 59/95; H10K 59/131; H10K 2102/341; H05K 1/189
See application file for complete search history.

(56) References Cited

U.S. PATENT DOCUMENTS

| | | | |
|---|---|---|---|
| 10,561,022 B2 * | 2/2020 | Kwon | H05K 1/147 |
| 11,177,331 B2 * | 11/2021 | Seo | H10K 59/123 |
| 11,818,839 B2 * | 11/2023 | Chung | H05K 1/111 |
| 2016/0352031 A1 * | 12/2016 | Ito | H05K 1/147 |
| 2023/0032028 A1 * | 2/2023 | Hong | G09G 3/3291 |
| 2024/0206259 A1 * | 6/2024 | Kim | H10K 59/90 |

FOREIGN PATENT DOCUMENTS

| | | | | |
|---|---|---|---|---|
| KR | 20180036270 A | * | 4/2018 | ......... G02F 1/13452 |
| KR | 20180071051 A | * | 6/2018 | ......... H01L 51/5203 |

* cited by examiner

*Primary Examiner* — Joe H Cheng
(74) *Attorney, Agent, or Firm* — Seed Intellectual Property Law Group LLP

(57) ABSTRACT

Provided is a display device. A display panel includes a plurality of subpixels and is supplied with an electrical signal through pixel pads to drive the subpixels. At least one driving circuit is mounted on a chip-on-film. The chip-on-film delivers the electrical signal through film pads electrically connected to the pixel pads. The chip-on-film includes an insulating film provided on side surfaces of the film pads.

23 Claims, 13 Drawing Sheets

DISPLAY DEVICE

CROSS REFERENCE TO RELATED APPLICATION

This application claims priority from Korean Patent Application No. 10-2023-0151426, filed on Nov. 6, 2023, which is hereby incorporated by reference for all purposes as if fully set forth herein.

BACKGROUND

Technical Field

Embodiments relate to a display device and, more particularly, to a display device having a configuration able to reduce electrical defects between pads due to ion migration in a chip-on-film connecting a display panel and a printed circuit board (PCB).

Description of the Related Art

In response to the development of the information society, demand for various types of display devices for displaying images is increasing. In this regard, a range of display devices, such as liquid crystal display (LCD) devices and organic light-emitting display devices, have recently come into widespread use.

Among such display devices, organic light-emitting display devices are advantageous in terms of rapid response rates, high contrast ratios, high emission efficiency, high luminance, wide viewing angles, and the like, since organic light-emitting diodes (OLEDs) emitting light by themselves are used therein.

Such an organic light-emitting display device may include OLEDs disposed in a plurality of subpixels arrayed in a display panel, and may control the OLEDs to emit light by controlling current flowing through the OLEDs, thereby displaying an image while controlling the luminance of subpixels.

Such display devices generally use a structure in which a driving circuit is mounted on the display panel using a chip-on-film (COF) structure and connected to signal lines of the display panel.

In this regard, such a chip-on-film is provided with pads for electrical contact with the signal line of the display panel.

BRIEF SUMMARY

As the resolution of the display panel increases, the number of pads provided on the chip-on-film may be increased, thereby resulting in an increase in the potential difference between the pads. In addition, as the stacking structure of the display panel is more complex, the adhesion between the signal lines of the display panel and the pads provided on the chip-on-film may decrease, thereby increasing the likelihood of moisture ingress. The inventors of the present disclosure have recognized the various technical problems in the related art, and appreciated that as a result of these issues, ions from the metals, of which the pads of the chip-on-film are formed, may migrate to adjacent pad areas, thereby resulting in electrical defects such as short circuits. Accordingly, the inventors of the present disclosure have provided various embodiments of a display device having a configuration able to reduce electrical defects between adjacent pads due to ion migration in a chip-on-film connecting a display panel and a printed circuit board (PCB). Various embodiments of the present disclosure address technical problems in the related art, including the specific problem identified above.

Embodiments may provide a display device having a configuration in which an insulating film may be provided on side surfaces of pads provided on the chip-on-film to prevent ion migration between adjacent pads.

Embodiments may provide a display device including: a display panel including a plurality of subpixels and supplied with an electrical signal through pixel pads to drive the subpixels; and a chip-on-film on which at least one driving circuit is mounted, the chip-on-film delivering the electrical signal through film pads electrically connected to the pixel pads, wherein the chip-on-film includes an insulating film provided on side surfaces of the film pads.

In addition, embodiments may provide a display device including: a display panel including a plurality of subpixels and supplied with an electrical signal through pixel pads to drive the subpixels; and a chip-on-film on which at least one driving circuit is mounted, the chip-on-film delivering the electrical signal through film pads electrically connected to the pixel pads. The chip-on-film may include: a film circuit board; the film pads provided on the film circuit board at selected distances; a thin film pattern covering the film pads; and an insulating film provided on side surfaces of the film pads.

According to embodiments, in the chip-on-film connecting the display panel and the PCB, electrical defects between the adjacent pads due to ion migration may be reduced.

Further, according to embodiments, due to the insulating film provided on side surfaces of pads provided on the chip-on-film, ion migration between the adjacent pads may be prevented.

In addition, according to embodiments, the use of any chemical treatment or chemicals that prevent ion migration between pads disposed on the chip-on-film is not required, and thus hazardous substances may be substituted or hazardous processes may be improved.

BRIEF DESCRIPTION OF THE SEVERAL VIEWS OF THE DRAWINGS

The above and other objectives, features, and advantages of the present disclosure will be more clearly understood from the following detailed description, taken in conjunction with the accompanying drawings, in which.

DETAILED DESCRIPTION

Figure 1:
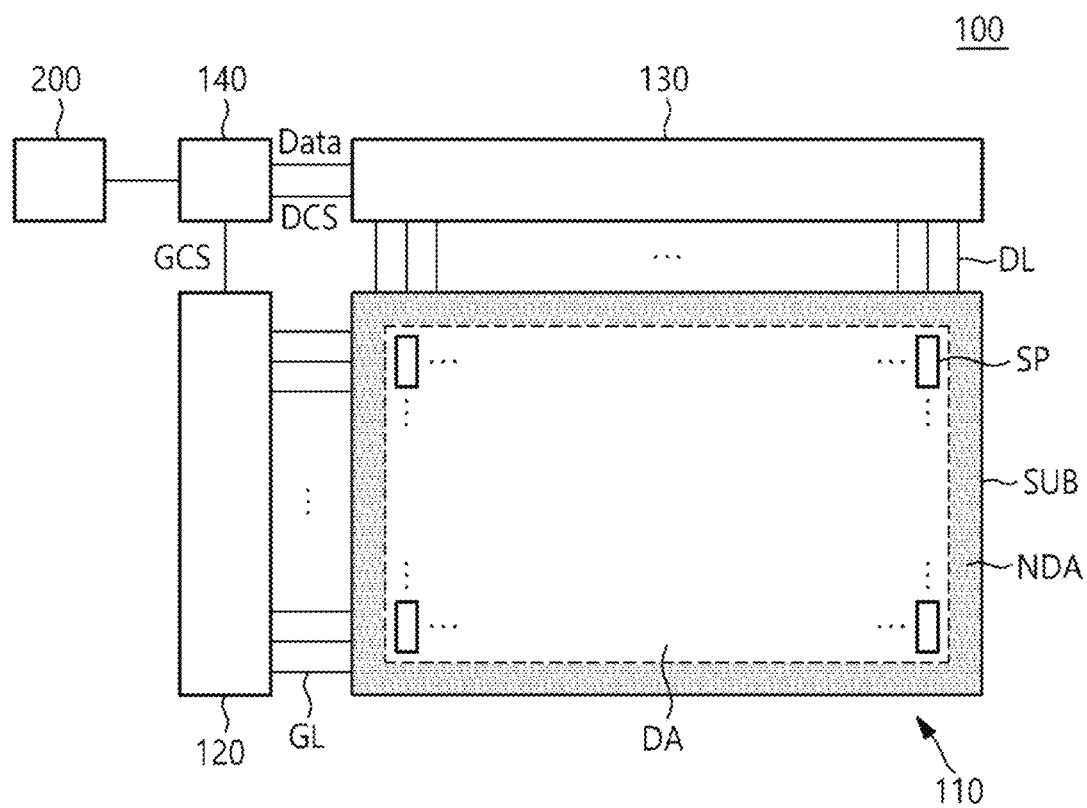
FIG. 1 schematically illustrates a display device according to embodiments.

Hereinafter, some embodiments of the present disclosure will be described in detail with reference to exemplary drawings. In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "made up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 schematically illustrates a display device according to embodiments.

Referring to FIG. 1, a display device 100 according to embodiments may include a display panel 110 and a driving circuit for driving the display panel 110

The display panel 110 may include a display area DA where an image is displayed and a non-display area NDA where no image is displayed. The non-display area NDA may also be referred to as the bezel area.

The display panel 110 may include a plurality of subpixels SP for displaying an image. For example, the plurality of subpixels SP may be disposed in the display area DA. In some cases, at least one subpixel SP may be disposed in the non-display area NDA. The at least one subpixel SP disposed in the non-display area NDA may also be referred to as a dummy subpixel.

The display panel 110 may include a plurality of signal lines for driving the plurality of subpixels SP. For example, the plurality of signal lines may include a plurality of data lines DL and a plurality of gate lines GL. The signal lines may further include signal lines other than the plurality of data lines DL and the plurality of gate lines GL, depending on the structure of the subpixels SP. For example, the other signal lines may include a driving voltage line and a reference voltage line, and the like.

The plurality of data lines DL and the plurality of gate lines GL may intersect each other. Each of the plurality of data lines DL may be arranged to extend in a first direction. Each of the plurality of gate lines GL may be arranged to extend in a second direction. Here, the first direction may be a column direction, and the second direction may be a row direction. In the present disclosure, the column direction and the row direction are relative. For example, the column direction may be a vertical direction, and the row direction may be a horizontal direction. In another example, the column direction may be a horizontal direction, and the row direction may be a vertical direction.

The driving circuit may include a data driving circuit 130 for driving the plurality of data lines DL and a gate driving circuit 120 for driving the plurality of gate lines GL. The driving circuit may further include a timing controller 140 for controlling the data driving circuit 130 and the gate driving circuit 120.

The data driving circuit 130 is a circuit for driving the plurality of data lines DL, and may output data signals (also referred to as data voltages) corresponding to image signals to the plurality of data lines DL. The gate driving circuit 120 is a circuit for driving the plurality of gate lines GL, and may generate gate signals and output gate signals to the plurality of gate lines GL. The gate signals may include one or more scanning signals and emission signals.

The timing controller 140 may start the scanning according to the timing defined for respective frames, and may control the data driving at appropriate times according to the scanning. The timing controller 140 may convert image data (or video data) input from an external source into image data Data having a data signal format readable by the data driving circuit 130 and supply the converted image data Data to the data driving circuit 130.

The timing controller 140 may receive display driving control signals from an external host system 200 along with the input image data. For example, the display driving control signals may include a vertical synchronization signal, a horizontal synchronization signal, an input data enable signal, a clock signal, and the like.

The timing controller 140 may generate a data driving control signal DCS and a gate driving control signal GCS based on the display driving control signals input from the host system 200. The timing controller 140 may supply the data driving control signal DCS to the data driving circuit 130 to control the driving operation and driving timing of the data driving circuit 130. The timing controller 140 may supply the gate driving control signal GCS to the gate driving circuit 120 to control the driving operation and drive timing of the gate driving circuit 120.

The data driving circuit 130 may include one or more source driving integrated circuits (SDICs). Each of the source driving integrated circuits may include a shift register, a latch circuit, a digital to analog converter (DAC), an output buffer, and the like. Each of the source driving integrated circuits may further include, in some cases, an analog to digital converter (ADC).

For example, each of the source driving integrated circuits may be connected to the display panel 110 by a tape automated bonding (TAB) method, connected to a corresponding bonding pad on the display panel 110 by a chip-on-glass (COG) method or a chip-on-panel (COP) method, or implemented by a chip-on-film (COF) method to be connected to the display panel 110.

The gate driving circuit 120 may output a gate signal having a turn-on level voltage or may output a gate signal having a turn-off level voltage, depending on the control of the timing controller 140. The gate driving circuit 120 may sequentially supply the gate signal having a turn-on level voltage to the plurality of gate lines GL to sequentially drive the plurality of gate lines GL.

The gate driving circuit 120 may include one or more gate driving integrated circuits (GDICs).

The gate driving circuit 120 may be connected to the display panel 110 by a tape automated bonding (TAB) method, to bonding pads on the display panel 110 by a chip-on-glass (COG) method or a chip-on-panel (COP) method, or connected to the display panel 110 by a chip-on-film (COF) method. In another example, the gate driving circuit 120 may be implemented by a gate-in-panel (GIP) method to be provided in the non-display area NDA of the display panel 110. The gate driving circuit 120 may be disposed on or connected to the substrate. That is, when the gate driving circuit 120 is of a GIP type, the gate driving circuit 120 may be disposed in the non-display area NDA of the substrate. When the gate driving circuit 120 is of a COG type, a COF type, or the like, the gate driving circuit 120 may be connected to the substrate.

In addition, at least one driving circuit of the data driving circuit 130 and the gate driving circuit 120 may be disposed in the display area DA. For example, the at least one driving circuit of the data driving circuit 130 and the gate driving circuit 120 may be disposed so as not to overlap the subpixels SP, or disposed such that a portion or the entirety of the at least one driving circuit overlaps the subpixels SP.

The data driving circuit 130 may be connected to one side (e.g., the top or bottom portion) of the display panel 110. The data driving circuit 130 may be connected to both sides (e.g., both the top and bottom portions) of the display panel 110 or to two or more sides of the four sides of the display panel 110, depending on the driving method, the design of the display panel, or the like.

The gate driving circuit 120 may be connected to one side (e.g., the left or right portion) of the display panel 110. The gate driving circuit 120 may be connected to both sides (e.g., both the left and right portions) of the display panel 110 or to two or more sides of the four sides of the display panel 110, depending on the driving method, the design of the display panel, or the like.

The timing controller 140 may be implemented as a separate component from the data driving circuit 130, or may be integrated with the data driving circuit 130 to form an integrated circuit. The timing controller 140 may be a controller used in general display technology, a control device including a timing controller and able to perform other control functions, or a circuit within the control device. The timing controller 140 may be implemented as a variety of circuits or electronic components, such as an integrated circuit (IC), a field programmable gate array (FPGA), an application specific integrated circuit (ASIC), or a processor.

The timing controller 140 may be mounted on a printed circuit board (PCB), a flexible printed circuit (FPC), or the like, and may be electrically connected to the data driving circuit 130 and the gate driving circuit 120 through the PCB, the FPC, or the like. The controller 140 may transmit and receive signals to and from the data driving circuit 130 using one or more selected interfaces. Here, for example, the interfaces may include a low voltage differential signaling (LVDS) interface, an embedded clock point to point interface (EPI), a serial peripheral interface (SPI), and the like.

The display device 100 according to embodiments may be a self-emitting display device in which the display panel 110 emits light by itself. When the display device 100 according to embodiments is a self-emitting display device, each of the plurality of subpixels SP may include a light-emitting element. For example, the display device 100 according to embodiments may be an organic light-emitting display device in which each of the light-emitting elements is implemented as an organic light emitting diode (OLED). In another example, the display device 100 according to embodiments may be an inorganic light-emitting display device in which each of the light-emitting elements is implemented as an inorganic-based light emitting diode. In another example, the display device 100 according to embodiments may be a quantum dot display device in which each of the light emitting elements is implemented as a quantum dot which is a semiconductor crystal emitting light by itself.

Figure 2:
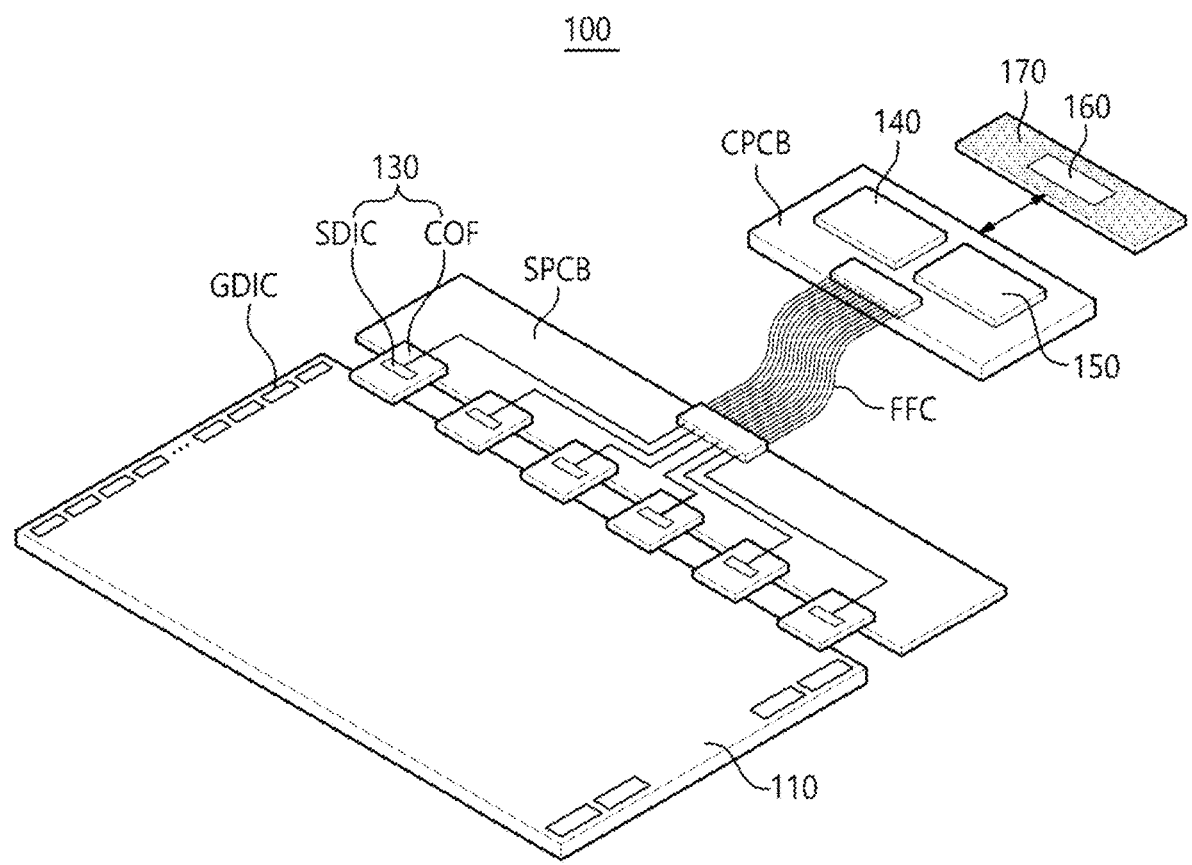
FIG. 2 illustrates an example system of the display device according to embodiments.

FIG. 2 illustrates an example system of the display device according to embodiments.

Referring to FIG. 2, the display device 100 according to embodiments is shown with the data driving circuit 130 implemented as a COF type among various types (e.g., TAB, COG, and COF types) and the gate driving circuit 120 implemented as a GIP type among various types (e.g., TAB, COG, COF, and GIP types).

When the gate driving circuit 120 is implemented as a GIP type, a plurality of gate driving integrated circuits GDIC included in the gate driving circuit 120 may be formed directly in the non-display area of the display panel 110. In this case, the gate driving integrated circuits GDIC may be supplied with various signals (such as a clock signal, a gate high signal, and a gate low signal) required to generate scanning signals through gate driving-related signal lines and disposed in the non-display area.

Similarly, one or more source driving integrated circuits SDIC included in the data driving circuit 130 may each be mounted on a chip-on-film COF, and one side of the chip-on-film COF may be electrically connected to the display panel 110. In addition, lines for electrically connecting the source driving integrated circuits SDIC and the display panel 110 may be disposed on the tops of the chip-on-films COF.

Such a display device 100 may include, for circuit connection between the plurality of source driving integrated circuits SDIC and other devices, at least one source printed circuit board SPCB and a control printed circuit board CPCB having control components and various electrical devices mounted thereon.

In this case, the other side of the chip-on-film COF on which the source driving integrated circuit SDIC is mounted may be connected to the at least one source printed circuit board SPCB. That is, one side of the chip-on-film COF on which the source driving integrated circuit SDIC is mounted may be electrically connected to the display panel 110, and the other side of the same chip-on-film COF may be electrically connected to the source printed circuit board SPCB.

A timing controller 140 and a power management circuit 150 may be mounted on the control printed circuit board CPCB. The timing controller 140 may control the operation of the data driving circuit 130 and the gate driving circuit 120. The power management circuit 150 may supply a driving voltage or current to the display panel 110, the data driving circuit 130, the gate driving circuit 120, and the like, and may control the voltage or current supplied.

The at least one source printed circuit board SPCB and the control printed circuit board CPCB may be circuit-connected by at least one connecting member. The connecting member may include, for example, a flexible printed circuit FPC, a flexible flat cable FFC, or the like. Furthermore, the at least one source printed circuit board SPCB and the control printed circuit board CPCB may be integrated and realized on a single printed circuit board.

The display device 100 may further include a set board 170 electrically connected to the control printed circuit board CPCB. In this case, the set board 170 may also be referred to as a power board. Such a set board 170 may have a main power management circuit 160 to manage the overall power of the display device 100. The main power management circuit 160 may work in concert with the power management circuit 150.

In the case of the display device 100 having the above configuration, the driving voltage is generated on the set board 170 and delivered to the power management circuit 150 in the control printed circuit board CPCB. The power management circuit 150 delivers the driving voltage required for display driving or characteristic value sensing to the source printed circuit board SPCB via the flexible printed circuit FPC or the flexible flat cable FFC. The driving voltage delivered to the source printed circuit board SPCB is supplied to the source driving integrated circuit SDIC to illuminate or sense a specific subpixel SP within the display panel 110.

In this case, each of the subpixels SP arranged on the display panel 110 in the display device 100 may include a light-emitting element and a circuit element, such as a drive transistor, for driving the light-emitting element.

The type and number of circuit elements of each subpixel SP may vary depending on the function provided, the design method, and the like.

Figure 3:
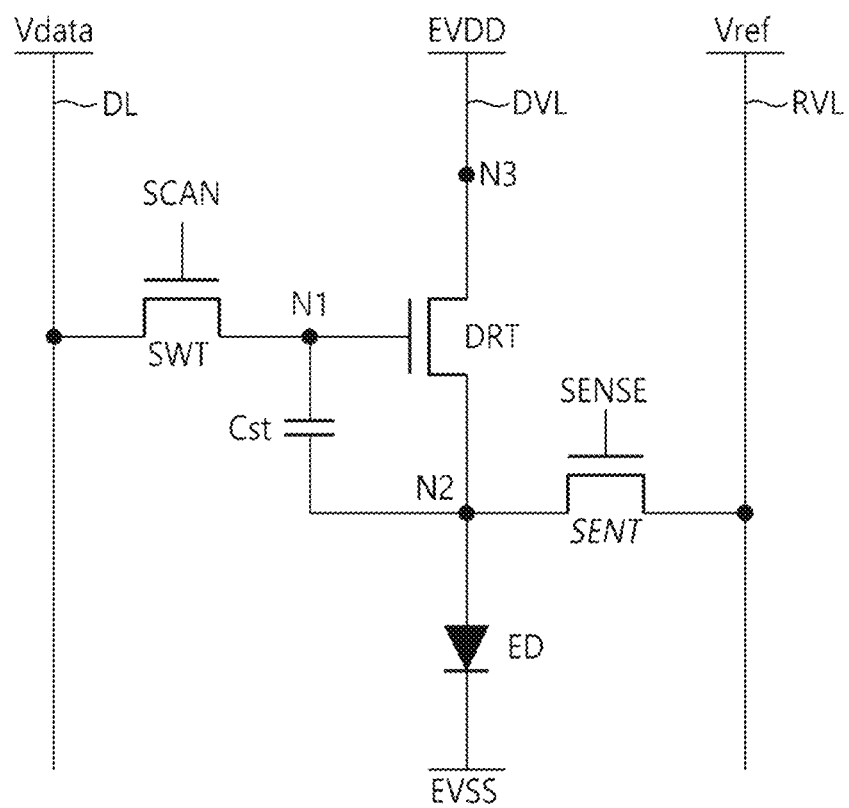
FIG. 3 illustrates a circuit of a subpixel in the display device according to embodiments.

FIG. 3 illustrates a circuit of a subpixel in the display device according to embodiments.

Referring to FIG. 3, in the display device 100 according to embodiments, a subpixel SP may include one or more transistors and capacitors, and an organic light-emitting diode (OLED) may be disposed as a light-emitting element (or light-emitting device) ED.

For example, the subpixel SP may include a driving transistor DRT, a switching transistor SWT, a sensing transistor SENT, a storage capacitor Cst, and the light-emitting element ED.

The driving transistor DRT has a first node N1, a second node N2, and a third node N3. The first node N1 of the driving transistor DRT may be a gate node to which a data voltage Vdata is applied from the data driving circuit 130 through a data line DL when the switching transistor SWT is turned on. The second node N2 of the driving transistor DRT may be electrically connected to the anode of the light-emitting element ED, and may be a source node or a drain node. The third node N3 of the driving transistor DRT may be electrically connected to a high-potential voltage line DVL to which a high-potential subpixel driving voltage EVDD is applied, and may be a drain node or a source node.

Here, during a display driving period, the subpixel driving voltage EVDD required to display an image may be supplied to the high-voltage voltage line DVL. For example, the subpixel driving voltage EVDD required to display the image may be 27 V.

The switching transistor SWT is electrically connected to the first node N1 of the driving transistor DRT and to the data line DL and operates in response to the scanning signal SCAN supplied through the gate line GL connected to the gate node. In addition, when the switching transistor SWT is turned on, a data voltage Vdata supplied through the data line DL is delivered to the gate node of the driving transistor DRT to control the operation of the driving transistor DRT.

The sensing transistor SENT is electrically connected to the second node N2 of the driving transistor DRT and to the reference voltage line RVL and operates in response to the sensing signal SENSE supplied through the gate line GL connected to the gate node. When the sensing transistor SENT is turned on, a sensing reference voltage Vref supplied through the reference voltage line RVL is delivered to the second node N2 of the driving transistor DRT.

In other words, the voltage of the first node N1 and the voltage of the second node N2 of the driving transistor DRT may be controlled by controlling the switching transistor SWT and the sensing transistor SENT, thereby allowing a current to be supplied to drive the light-emitting element ED.

The gate nodes of the switching transistor SWT and the sensing transistor SENT may be connected together to a single gate line GL or connected to different gate lines GL. Here, a structure in which the switching transistor SWT and the sensing transistor SENT are connected to different gate lines GL is shown as an example. In this case, the switching transistor SWT and the sensing transistor SENT may be controlled independently by the scanning signal SCAN and the sensing signal SENSE delivered through the different gate lines GL.

In contrast, when the switching transistor SWT and the sensing transistor SENT are connected to the single gate line GL, the switching transistor SWT and the sensing transistor SENT may be controlled simultaneously by the scanning signal SCAN or the sensing signal SENSE transmitted through the single gate line GL, and the aperture ratio of the subpixel SP may be increased.

In addition, each of the transistors disposed in the subpixel SP may be implemented as an n-type transistor as well as a p-type transistor. Here, a case in which the transistors are implemented as n-type transistors is shown as an example.

The storage capacitor Cst is electrically connected to the first node N1 and the second node N2 of the driving transistor DRT and maintains the data voltage Vdata for a single frame.

Such a storage capacitor Cst may be connected to the first node N1 and the third node N3 of the driving transistor DRT depending on the type of the driving transistor DRT. The anode of the light-emitting element ED may be electrically connected to the second node N2 of the driving transistor DRT, and a low-potential base voltage EVSS may be applied to the cathode of the light-emitting element ED.

Here, the base voltage EVSS may be a ground voltage, or may be a voltage higher or lower than the ground voltage. Further, the base voltage EVSS may be variable depending on the driving state. For example, the base voltage EVSS during display driving may be set differently than the base voltage EVSS during sensing driving.

The structure of the subpixel SP described above as an example has a 3T1C structure consisting of three transistors and a single capacitor. However, this is for illustrative purposes only, and the subpixel SP may include one or more transistors, or in some cases, one or more capacitors. In another example, all of the plurality of subpixels SP may have the same structure, or some of the plurality of subpixels SP may have different structures.

Figure 4:
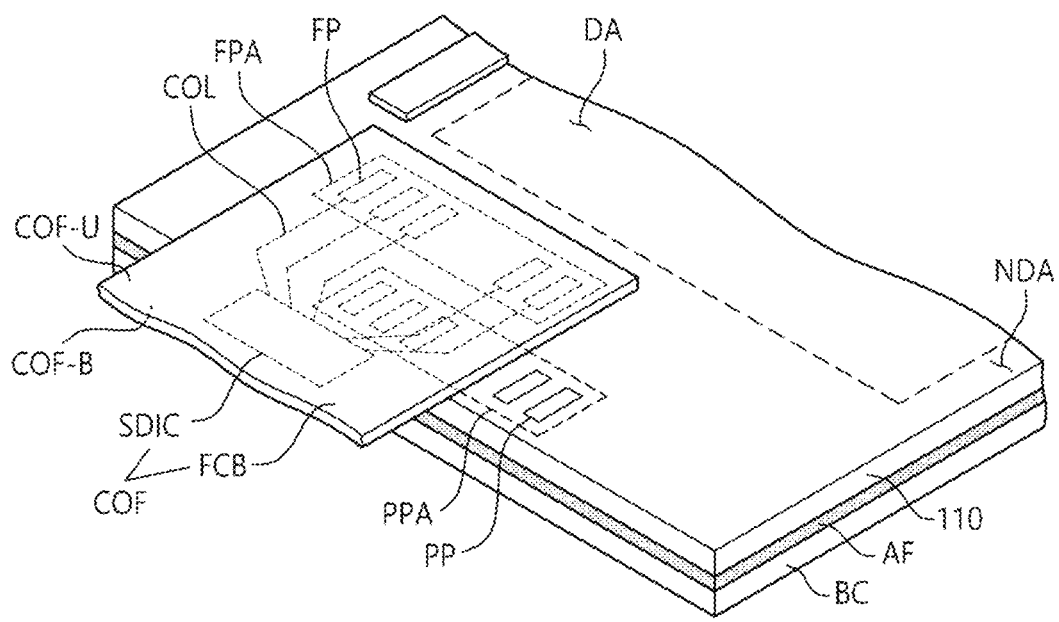
FIG. 4 is an enlarged perspective view illustrating a region to which a chip-on-film is coupled in the display device according to embodiments.

FIG. 4 is an enlarged perspective view illustrating a region to which a chip-on-film is coupled in the display device according to embodiments.

Referring to FIG. 4, in the display device 100 according to embodiments, the display panel 110 may be coupled to a bottom cover BC by an adhesive AF.

A chip-on-film COF may be coupled to the display panel 110 in the non-display area NDA.

A pixel pad area PPA of the display panel 110 is provided in a portion of the non-display area NDA corresponding to the chip-on-film COF.

A plurality of pixel pads PP are disposed in the pixel pad area PPA. Some of the pixel pads PP may be connected to corresponding pixels, and the other of the pixel pads PP may be connected to the gate driving circuit or the data driving circuit. The plurality of pixel pads PP may be electrically connected to a plurality of film pads FP provided on the chip-on-film COF.

The chip-on-film COF may include a film circuit board FCB, a source driving integrated circuit SDIC, the plurality of film pads FP, and a plurality of film lines COL. The plurality of film pads FP are provided in a film pad area FPA of the film circuit board FCB to correspond to the pixel pads PP of the display panel 110.

The chip-on-film COF includes a film upper surface COF-U and a film back surface COF-B.

The film pad area FPA may correspond to an open area provided in the back side of the film circuit board FCB to expose a plurality of film pads FP. The back side of the film circuit board FCB may be defined as the back surface COF-B of the chip-on-film COF.

The film circuit board FCB of the chip-on-film COF may be flexible so as to be bent. The film circuit board FCB may be provided in various shapes corresponding to the purpose and structure of the display panel 110.

The source driving integrated circuit SDIC may be mounted on the film circuit board FCB of the chip-on-film COF. The source driving integrated circuit SDIC may be a circuit for supplying data voltages to the pixels disposed on the display panel 110.

Although the source driving integrated circuit SDIC is described herein as being mounted on the chip-on-film COF as an example, a gate driving integrated circuit applying a gate signal to the display panel 110 may also be mounted on the chip-on-film COF when the gate driving integrated circuit is configured in the form of a chip-on-film.

The plurality of film pads FP may be exposed to the back surface COF-B of the chip-on-film COF. The exposed plurality of film pads FP may be electrically connected to respective corresponding pixel pads PP.

First ends of the plurality of film pads FP provided on the chip-on-film COF are connected to the corresponding film lines COL. The film lines COL are connected to the source driving integrated circuit SDIC. Accordingly, the pixels of the display panel 110 may be connected to the source driving integrated circuit SDIC to be provided with a data voltage.

The plurality of film pads FP may be formed of a highly electrically conductive metal material such as copper.

Figure 5:
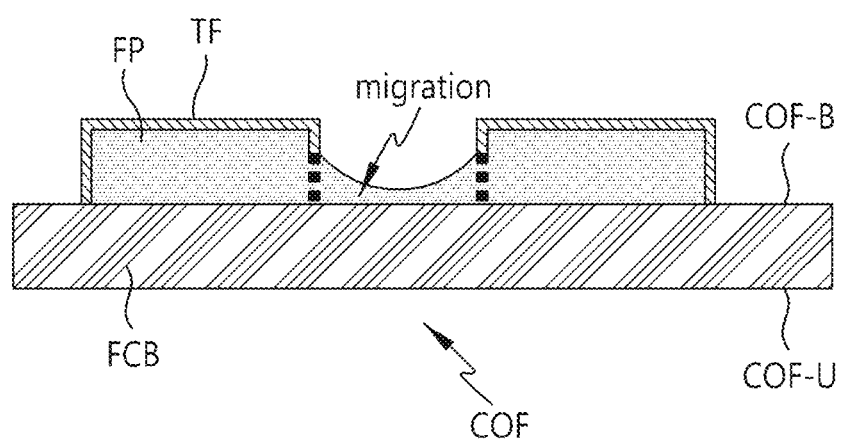
FIG. 5 is an example cross-sectional view illustrating a chip-on-film coupled to the display panel in the display device according to embodiments.

FIG. 5 illustrates an example cross-sectional structure of a chip-on-film coupled to the display panel in the display device according to embodiments.

For ease of explanation, the chip-on-film COF is illustrated herein in a structure in which the film upper surface COF-U of the chip-on-film COF is located at a lower position and the film back surface COF-B of the chip-on-film COF is located at a higher position.

Referring to FIG. 5, in display device 100 according to embodiments, the chip-on-film COF coupled to display panel 110 may include a plurality of film pads FP provided on a flexible circuit board FCB and a thin film pattern TF formed to cover the film pads FP.

The plurality of film pads FP may include a driving voltage pad supplying a high-potential driving voltage or a low-potential driving voltage, a clock signal pad supplying a clock signal, a data voltage pad supplying a data voltage, a gate signal pad transmitting a gate signal, and the like.

The film pads FP may be formed by at least one of evaporation, plating, and sputtering.

For example, the film pads FP may be formed by electroplating after sputtering. In another example, the film pads FP may be a copper metal layer formed by electroless plating or electrolytic plating.

After the film pads FP are formed on the flexible circuit board FCB, a dry film may be laminated on the film pads FP, and patterned film lines COL may be formed on the upper surface and the back surface of the flexible circuit board FCB through exposure, development, and etching processes.

The film pads FP formed on the flexible circuit board FCB may include a metal material having high electrical conductivity. Specifically, the film pads FP may include copper (Cu). However, embodiments are not limited thereto, and may include at least one selected from among copper (Cu), aluminum (Al), chromium (Cr), nickel (Ni), silver (Ag), molybdenum (Mo), gold (Au), titanium (Ti), and alloys thereof.

On the other hand, a thin film pattern TF may be provided on the film pads FP to improve the accuracy of bonding to the display panel 110 and the convenience of a fabricating process.

The thin film pattern TF may be formed as a single layer, or a plurality of layers may be laminated. When the thin film pattern TF includes a first thin film pattern and a second thin film pattern, the first thin film pattern may be disposed on the film pads FP, and the second thin film pattern may be formed on the first thin film pattern.

The thin film pattern TF may include tin (Sn). For example, the film pads FP may be formed of copper (Cu), and the thin film pattern TF may be formed of tin (Sn).

Because tin (Sn) has excellent corrosion resistance, when the thin film pattern (TF) formed on the film pads FP includes tin (Sn), an effect of preventing oxidation of the film pads FP may be obtained.

The thin film pattern TF may have a lower electrical conductivity than the film pads FP.

The first thin film pattern and the second thin film pattern may be formed of the same material, i.e., tin (Sn), but may be formed by separate processes.

In addition, the plurality of film pads FP may further include a random number of dummy pads disposed between selected film pads. The dummy pads may be formed of the same metal material as the film pads FP.

The thin film pattern TF may not be formed on the outer side of the dummy pad, and may be formed with a thickness equal to the sum of the thickness of the film pads FP and the thickness of the thin film pattern TF formed on the surface of the film pads FP.

The resolution and size of the display device 110 are increasing, but the number of the chip-on-films COF coupled to the display panel 110 is decreasing due to the trend of implementing narrower bezels to reduce the size of the non-display area. Accordingly, the number of the film pads FPs formed on one chip-on-film COF tends to increase, and the potential difference between the film pads FPs tends to increase.

Furthermore, as the display device 100 includes not only a display function but also a touch function, the multi-layer structure of the pixel pad area increases. In a high temperature and humidity environment, the adhesion between the respective layers may deteriorate, thereby resulting in frequent moisture ingress into the film pads FP of the chip-on-film COF.

When the film pads FPs of the chip-on-film COF are subjected to a heat treatment process such as thermal curing while moisture is present in the film pads FP, the copper (Cu) contained in the film pads FPs or the tin (Sn) contained in the thin film pattern TF may be ionized and migrate.

In this case, the migration of copper (Cu) or tin (Sn) ions may result in a defect that causes a short circuit in the adjacent film pads FP disposed on the chip-on-film COF.

In the display device 100 of the present disclosure, by disposing an insulating film on side surfaces of the film pads FP provided on the chip-on-film COF, short circuit defects caused by the migration phenomenon of metal ions may be reduced.

FIGS. 6 to 11 illustrate an example process of fabricating a chip-on-film of a display device according to embodiments.

Figure 6:
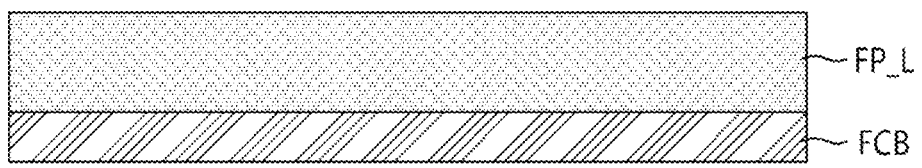
FIGS. 6 to 11 illustrate an example process of fabricating a chip-on-film of the display device according to embodiments.

First, referring to FIG. 6, to fabricate a chip-on-film COF of a display device according to embodiments, a film circuit board FCB is placed and a film pad layer FP_L is formed on an upper portion of the film circuit board FCB.

The film circuit board FCB may be a polyimide (PI) substrate. However, embodiments may include, but are not limited to, substrates formed of polymeric materials such as polyethylene terephthalate (PET), polyethylene naphthalate (PEN), and the like.

The film pad layer FP_L may be formed of a metal material for forming film pads FP, and may be formed of a highly electrically conductive material such as copper.

Figure 7:
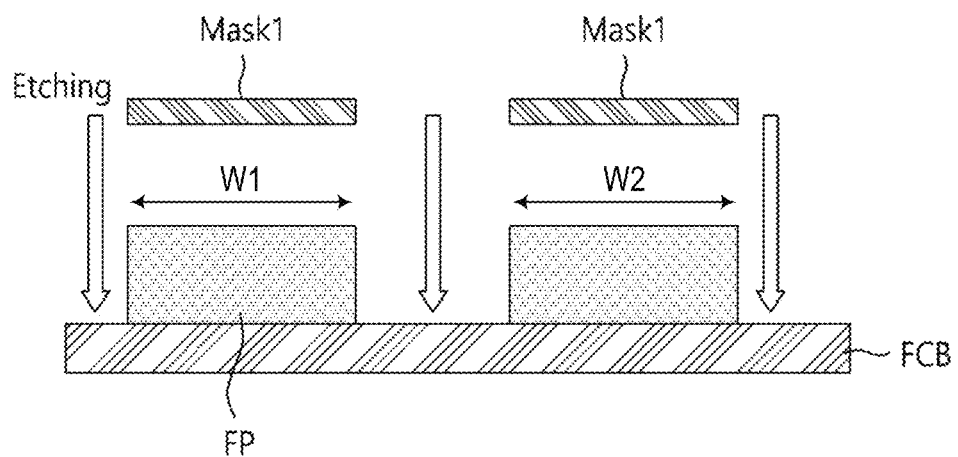

In this state, as shown in FIG. 7, a first mask Mask1 is placed at positions where the film pads FP are to be formed and the film pad layer FP_L is etched by an exposure process except for only portions of the film pad layer FP_L at the positions where the film pads FP are to be formed, thereby forming the film pads FP having a selected width W1, W2 at specified positions. The left width W1 and right width W2 of the film pads FP may vary depending on the size of the chip-on-film COF and the dimensions of the display panel 110, and may be, for example, 8 μm. In some embodiments, the width of each film pad may be the same. However, in other embodiments, the width of each film pad may differ from each other.

Figure 8:
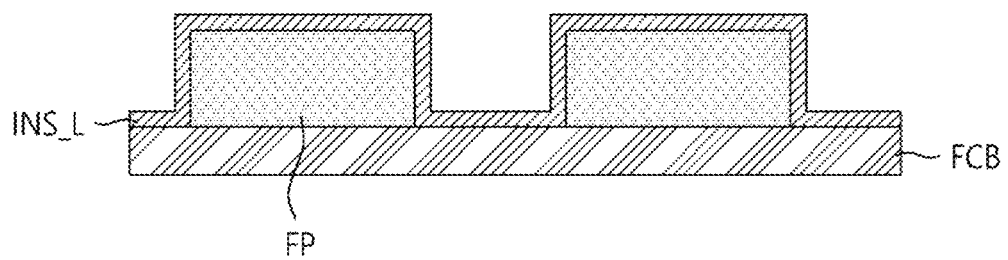

After the film pads FP having a selected pattern are formed on the film circuit board FCB, an insulating film layer INS_L covering the film pads FP is formed as shown in FIG. 8.

The insulating film layer INS_L is intended to prevent ions from the metal materials of the film pads FP from migrating to the adjacent film pads FP.

The insulating film layer INS_L may include an inorganic insulating material. The insulating film layer INS_L may include a silicon oxide, a silicon nitride, a silicon oxynitride, an aluminum oxide, a tantalum oxide, a hafnium oxide, a zirconium oxide, a titanium oxide, and the like. Specifically, the insulating film layer INS_L may include silicon dioxide ($SiO_2$).

Figure 9:
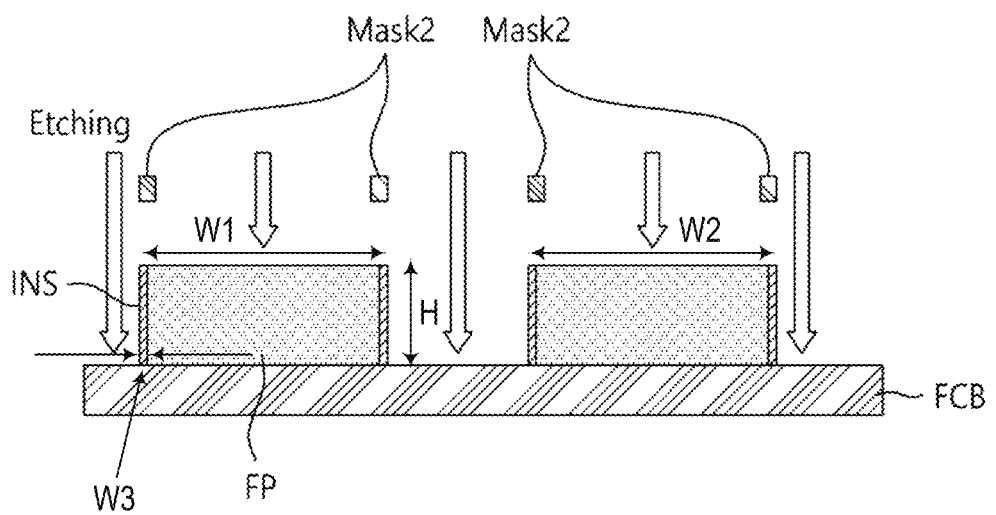

The insulating film layer INS_L covering the film pads FP may be etched using a second mask Mask2 covering side surfaces of the film pads FP, thereby leaving an insulating film INS only on the side surfaces of the film pads FP and removing the remaining portion of the film pads FP as shown in FIG. 9.

The width of the respective insulating film INS may be determined in the range of 2% to 5% of the width of the respective film pads FP. For example, when the width of the respective film pads FP is 8 μm, the width of the respective insulating film INS may be determined in the range of 0.16 μm to 0.4 μm. For instance, as shown in FIG. 9, a width W3 of the insulating film INS may be in the range of 2% to 5% of a width W1 of the film pad FP. Further, a height H of both the insulating film INS and the film pad FP may be the same such that the upper surface of the insulating film INS and the upper surface of the film pad FP are flush with each other.

Because the second mask Mask2 is formed to correspond to the side surfaces of the film pads FP, the second mask Mask2 will have a different structure than the first mask Mask1 for forming the film pads FP.

When the film pads FPs are formed of a copper (Cu) metal, copper ions generated by a heat treatment process or the like may migrate to the adjacent film pads FPs along the side surfaces of the film pads FPs. Accordingly, the insulating film INS may be formed to be disposed along the side surfaces of the film pads FP.

In this case, the portions of the film pads FP except for the side surfaces of the film pads FP may be removed because the remaining insulating films on the top of the film pads FP may increase the thickness of the film pads FP.

Figure 10:
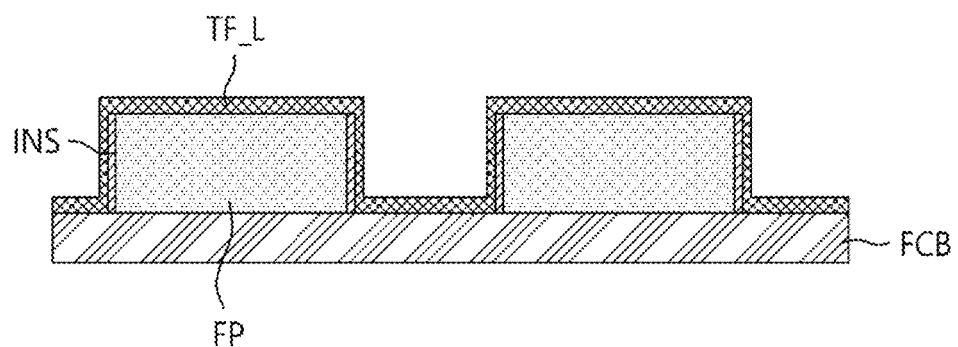

After the insulating film INS is formed along the side surfaces of the film pads FP, and a thin film pattern layer TF_L covering the film pads FP and the insulating film INS is formed as shown in FIG. 10.

The thin film pattern layer TF_L may include tin (Sn) or a tin alloy to prevent oxidation of the film pads FP.

Figure 11:
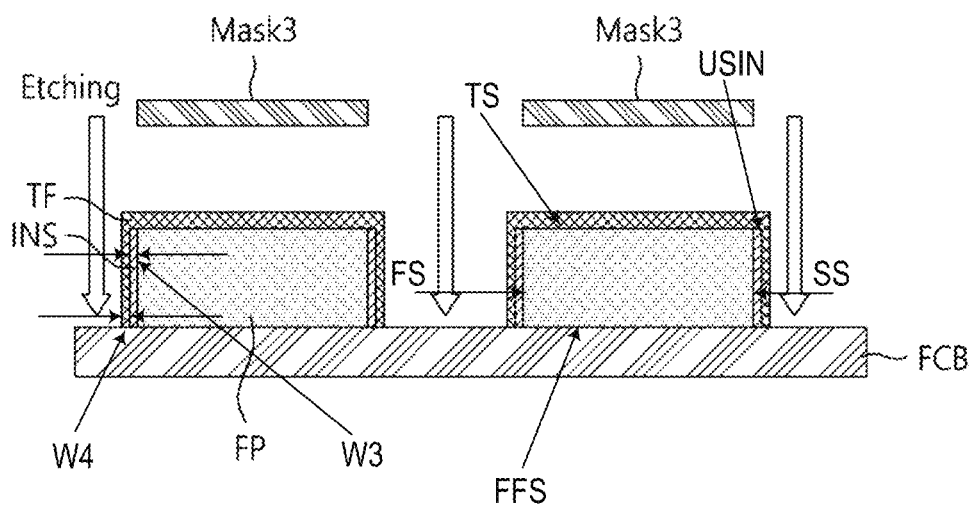

Thereafter, as shown in FIG. 11, the thin film pattern layer TF_L located on the top of the film circuit board FCB may be removed using a third mask 3, except for the top of the film pads FP and some side surfaces of the insulating film INS, thereby forming a thin film pattern TF.

The lateral width W4 of the thin film pattern TF may be the same as the width W3 of the respective insulating film INS. For example, when the insulating film INS has a width W3 of 0.2 μm, the thin film pattern TF may also be formed with a width W4 of 0.2 μm.

According to FIG. 11, the film pad FP is on the film circuit board FCB. Here, the film pad FP includes a first surface FS opposite a second surface SS, a third surface TS opposite a fourth surface FFS. The first surface FS may be referred to as a first side surface and the second surface SS may be referred to as a second side surface. The third surface TS may be referred to as an upper surface and the fourth surface FSS which faces the film circuit board FCB may be referred to as a bottom surface.

The film pad FP has a width W1 that can be defined between the first surface FS and the second surface SS of the film pad FP. The insulating film INS is disposed adjacent to the first surface FS and the second surface SS of the film pad FP and the insulating film INS has a width W3.

In some embodiments, the thin film pattern TF is on the first surface FS, the second surface SS, and the third surface TS of the film pad FP. The thin film pattern TF has a width W4 at either the first surface FS or the second surface SS or both of the film pad FP.

As shown in FIG. 11, the insulating film INS is in contact with the first surface FS and the second surface SS of the film pad FP. Here, the thin film pattern TF is in contact with the third surface TS of the film pad FP. The thin film pattern TF is also in contact with the outer side surface of the insulating film INS that is opposite of the film pad FP.

In addition, the insulating film INS does not cover the upper surface TS of the film pad FP and therefore, the insulating film INS does not overlap with the film pad FP from a plan view. The insulating film INS has an upper surface USIN and the film pad FP has an upper surface TS. In some embodiments, the upper surface USIN of the insulating film INS and an upper surface TS of the film pad FP are flush with each other.

The thin film pattern TF is formed to cover the top of the film pad FP. In this case, when the side surfaces of the film pads FP are sufficiently protected by the insulating film INS, it is not necessary to form the thin film pattern TF on the side surfaces of the insulating film INS, but in order to effectively prevent oxidation of the film pads FP, it may be effective to form the thin film pattern TF to cover the top and side surfaces of the film pads FP.

Accordingly, by disposing the insulating film INS along the side surfaces of the film pads FP and between the film pads FP and the thin film pattern TF covering the film pads FP, ions of the metal (copper) of the film pads FP may be prevented from migrating laterally and electrical defects such as short circuits may be reduced.

Figure 12A:
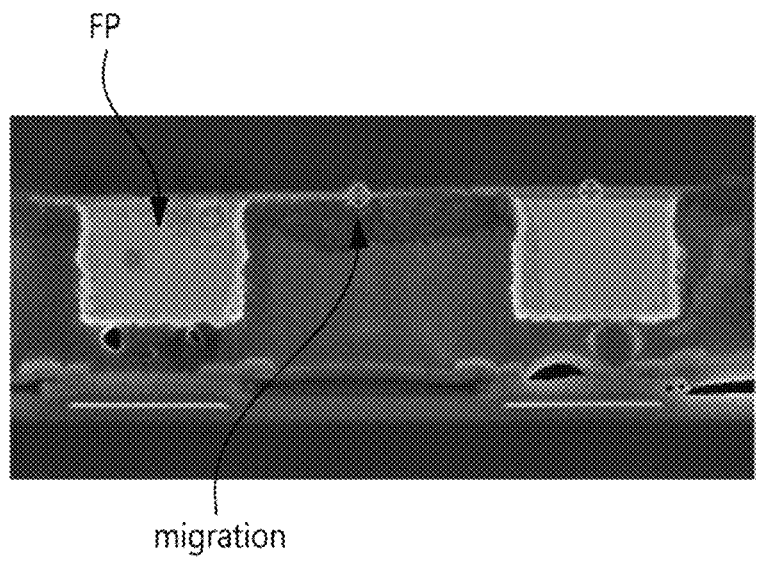
FIGS. 12A and 12B illustrate a comparison of ion migration phenomena in a display device according to embodiments, between a case in which no insulating film is formed on side surfaces of film pads and a case in which insulating films is formed on side surfaces of film pads.
Figure 12B:
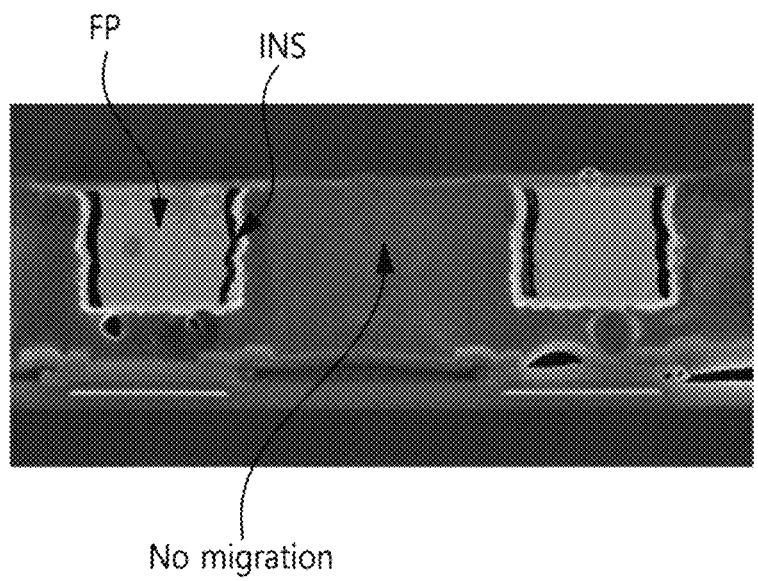

FIG. 12 illustrates a comparison of ion migration phenomena in a display device according to embodiments, between a case in which no insulating film is formed on side surfaces of film pads and a case in which insulating films is formed on side surfaces of film pads.

Referring to FIG. 12, in a case where no insulating film is formed on the side surfaces of the film pads FP formed on the chip-on-film COF (case (a)), a metal (e.g., copper) contained in the film pads FP may be ionized and migrate to the adjacent film pads along the side surfaces due to a heat treatment process or the like performed in a state where moisture is introduced into the film pads FP of the chip-on-film COF.

In contrast, in a case where the insulating film INS is formed on the side surfaces of the film pads FP formed on the chip-on-film COF (case (b)) as in the display device 100 of the present disclosure, ions generated on the film pads FP by a heat treatment process or the like may not migrate along the side surfaces, thereby reducing electrical defects caused by the migration phenomenon of metal ions.

In addition, in the chip-on-film COF of the display device 100 of the present disclosure, copper (Cu) ions of the film pads FP may migrate, and tin (Sn) ions of the thin film pattern TF formed on the top of the film pads FP may also migrate.

Accordingly, in the display device 100 of the present disclosure, insulating film INS may be formed on side surfaces of the thin film pattern TF in order to reduce the migration of tin (Sn) ions of the thin film pattern TF formed on the top of the film pads FP.

Figure 13:
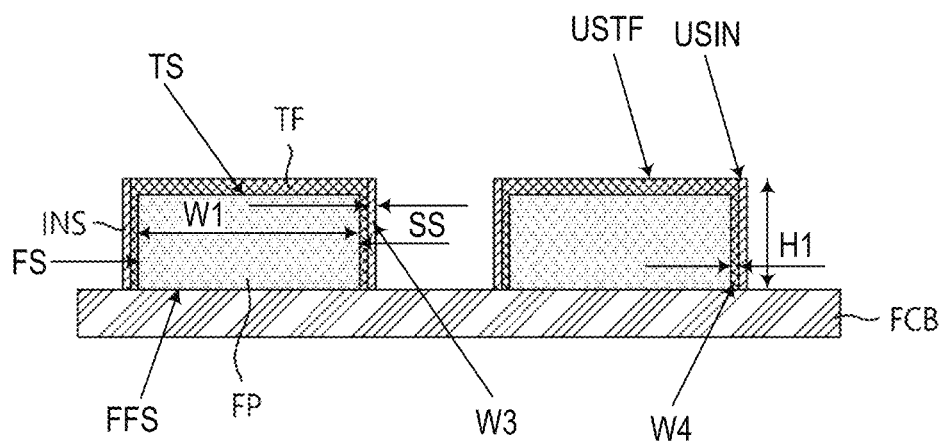
FIG. 13 is a cross-sectional view illustrating an example case in which the insulating films are formed on side surfaces of the thin film pattern formed on the top of the film pads in the display device according to embodiments.

FIG. 13 is a cross-sectional view illustrating an example case in which the insulating films are formed on side surfaces of the thin film pattern formed on the top of the film pads in the display device according to embodiments.

Referring to FIG. 13, the insulating film INS may be formed in the display device 100 according to embodiments to prevent ion migration along the side surfaces of the film pads FP and the thin film pattern TF disposed on the chip-on-film COF.

In this case, the process of forming the insulating film INS on the side surfaces of the film pads FP and the thin film pattern TF disposed on the chip-on-film COF is the same as the process shown in FIGS. 6 to 11, but the order of forming the thin film pattern TF and the insulating film INS may be changed.

In other words, in FIGS. 6 to 11, the insulating film INS was formed on the side surfaces of the film pads FP before the thin film pattern TF was formed, but in FIG. 13, the insulating film INS may be formed after the film pads FP and the thin film pattern TF are formed.

According to FIG. 13, the film pad FP is on the film circuit board FCB. Here, the film pad FP including a first surface FS opposite a second surface SS, a third surface TS opposite a fourth surface FFS. As shown, the fourth surface FSS faces the film circuit board FCB and is in direct contact with the film circuit board FCB. The film pad FP has a width W1 that can be defined between the first surface FS and the second surface SS of the film pad FP. The insulating film INS is disposed adjacent to the first surface FS and the second surface SS of the film pad FP and the insulating film INS has a width W3.

In some embodiments, the thin film pattern TF is on the first surface FS, the second surface SS, and the third surface TS of the film pad FP. The thin film pattern TF has a width W4 at either the first surface FS or the second surface SS or both of the film pad FP. As shown in FIG. 13, the insulating film INS is spaced apart from the first surface FS and the second surface SS of the film pad FP as the thin film pattern TF is present between the insulating film INS and the film pad FP. Here, the thin film pattern TF is in contact with the third surface TS of the film pad FP.

In addition, the insulating film INS does not cover the upper surface of the thin film pattern TF and therefore, the insulating film INS does not overlap with the thin film pattern TF from a plan view. The insulating film INS has a height H1 and is positioned as a wall at the first side FS and the second side SS of the film pad FP. The insulating film INS has an upper surface USIN and the thin film pattern TF has an upper surface USTF. In some embodiments, the upper surface USIN of the insulating film INS and an upper surface USTF of the thin film pattern TF are flush with each other.

As described above, in the display device 100 of the present disclosure, the insulating film INS formed on the side surfaces of the film pads FP formed on the chip-on-film COF or along the side surfaces of the thin film pattern TF may block ions generated in the film pads FP or the thin film pattern TF by a heat treatment process or the like from migrating along the sides, thereby reducing electrical defects caused by the migration phenomenon of metal ions.

The above-described embodiments of the present disclosure are briefly reviewed as follows.

A display device according to embodiments may include: a display panel including a plurality of subpixels and supplied with an electrical signal through pixel pads to drive the subpixels; and a chip-on-film on which at least one driving circuit is mounted, the chip-on-film delivering the electrical signal through film pads electrically connected to the pixel pads, wherein the chip-on-film includes an insulating film provided on side surfaces of the film pads.

The driving circuit may be a source driving integrated circuit supplying a data voltage to the display panel.

The chip-on-film may include: a film circuit board; the film pads provided on the film circuit board at selected distances; the insulating film disposed on side surfaces of the film pads; and a thin film pattern covering the film pads and the insulating film.

The film pads may include at least one metal among copper (Cu), aluminum (Al), chromium (Cr), nickel (Ni), silver (Ag), molybdenum (Mo), gold (Au), titanium (Ti), and alloys thereof.

The insulating film may include at least one among silicon oxide, silicon nitride, silicon oxynitride, aluminum oxide, tantalum oxide, hafnium oxide, zirconium oxide, and titanium oxide.

The width of the insulating film may range from 2% to 5% of the width of the film pads.

The thin film pattern may include tin (Sn).

The thin film pattern may include a plurality of layers.

The width of the thin film pattern may be the same as the width of the insulating film.

In addition, a display device according to the present disclosure may include: a display panel including a plurality of subpixels and supplied with an electrical signal through pixel pads to drive the subpixels; and a chip-on-film on which at least one driving circuit is mounted, the chip-on-film delivering the electrical signal through film pads electrically connected to the pixel pads. The chip-on-film may include: a film circuit board; the film pads provided on the film circuit board at selected distances; a thin film pattern covering the film pads; and an insulating film provided on side surfaces of the film pads.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a display panel including a plurality of subpixels and supplied with an electrical signal through pixel pads to drive the subpixels; and
a chip-on-film on which at least one driving circuit is mounted, the chip-on-film configured to transmit the electrical signal through film pads electrically connected to the pixel pads,
wherein the chip-on-film includes an insulating film provided on side surfaces of the film pads.

2. The display device of claim 1, wherein the driving circuit is a source driving integrated circuit supplying a data voltage to the display panel.

3. The display device of claim 1, wherein the chip-on-film comprises:
a film circuit board;
the film pads provided on the film circuit board at selected distances;
the insulating film disposed on side surfaces of the film pads; and
a thin film pattern covering the film pads and the insulating film.

4. The display device of claim 3, wherein the thin film pattern includes tin (Sn).

5. The display device of claim 3, wherein the thin film pattern includes a plurality of layers.

6. The display device of claim 3, wherein a width of the thin film pattern is equal to a width of the insulating film.

7. The display device of claim 1, wherein the film pads include at least one metal among copper (Cu), aluminum (Al), chromium (Cr), nickel (Ni), silver (Ag), molybdenum (Mo), gold (Au), titanium (Ti), and alloys thereof.

8. The display device of claim 1, wherein the insulating film includes at least one among silicon oxide, silicon nitride, silicon oxynitride, aluminum oxide, tantalum oxide, hafnium oxide, zirconium oxide, and titanium oxide.

9. The display device of claim 1, wherein a width of the insulating film ranges from 2% to 5% of a width of the film pads.

10. A display device comprising:
a display panel including a plurality of subpixels; and
a chip-on-film on which at least one driving circuit is mounted, the chip-on-film configured to transmit electrical signals through film pads electrically connected to pixel pads,
wherein the chip-on-film includes:
a film circuit board;

the film pads provided on the film circuit board at selected distances;

a thin film pattern covering the film pads; and an insulating film provided on side surfaces of the film pads.

11. The display device of claim 10, wherein the film pads comprise at least one metal among copper (Cu), aluminum (Al), chromium (Cr), nickel (Ni), silver (Ag), molybdenum (Mo), gold (Au), titanium (Ti), and alloys thereof.

12. The display device of claim 10, wherein the insulating film includes at least one among silicon oxide, silicon nitride, silicon oxynitride, aluminum oxide, tantalum oxide, hafnium oxide, zirconium oxide, and titanium oxide.

13. A device comprising:

a film circuit board;

a film pad on the film circuit board, the film pad including a first surface opposite a second surface, a third surface opposite a fourth surface, the fourth surface facing the film circuit board, the film pad having a first width defined between the first surface and the second surface; and an insulating film disposed adjacent to the first surface and the second surface of the film pad, the insulating film having a second width.

14. The device of claim 13, further comprising a thin film pattern on the first surface, the second surface, and the third surface of the film pad, the thin film pattern having a third width at either the first surface or the second surface of the film pad.

15. The device of claim 14, wherein the insulating film is in contact with the first surface and the second surface of the film pad, and wherein the thin film pattern contacts the third surface of the film pad.

16. The device of claim 15, wherein the third width of the thin film pattern is equal to the second width of the insulating film.

17. The device of claim 14, wherein the thin film pattern includes tin (Sn).

18. The device of claim 14, wherein the thin film pattern includes a plurality of layers.

19. The device of claim 13, wherein the insulating film is spaced apart from the first surface and the second surface of the film pad, and wherein the thin film pattern contacts the first surface, the second surface, and the third surface of the film pad.

20. The device of claim 19, wherein the insulating film does not overlap with the thin film pattern from a plan view.

21. The device of claim 19, wherein an upper surface of the insulating film and an upper surface of the thin film pattern are flush with each other.

22. The device of claim 19, wherein the third width of the thin film pattern is equal to the second width of the insulating film.

23. The device of claim 13, wherein the second width of the insulating film is about 2% to 5% of the first width of the film pad.

* * * * *